United States Patent [19]

Iwase et al.

[11] Patent Number: 4,882,227

[45] Date of Patent: Nov. 21, 1989

[54] CONDUCTIVE RESIN COMPOSITION AND MOLDED PRODUCT USING THE SAME

[75] Inventors: Hidehiro Iwase, Tokyo; Keiichi Habata, Kawaguchi, both of Japan

[73] Assignee: Toshiba Chemical Corporation, Tokyo, Japan

[21] Appl. No.: 165,905

[22] Filed: Mar. 9, 1988

[30] Foreign Application Priority Data

| Mar. 9, 1987 | [JP] | Japan | 62-51998 |
| Mar. 9, 1987 | [JP] | Japan | 62-51999 |
| Mar. 16, 1987 | [JP] | Japan | 62-58880 |
| Mar. 25, 1987 | [JP] | Japan | 62-68779 |
| Mar. 27, 1987 | [JP] | Japan | 62-71568 |
| Mar. 27, 1987 | [JP] | Japan | 62-71570 |
| Apr. 7, 1987 | [JP] | Japan | 62-83917 |

[51] Int. Cl.$^4$ ............................ H05K 9/00; C08K 3/08
[52] U.S. Cl. ..................... 428/407; 428/361; 428/379; 428/381; 428/385; 252/512; 252/513; 523/137; 523/205; 524/117; 524/120; 524/151; 524/239; 524/270; 524/274; 524/320; 524/322; 524/439; 524/440; 524/441
[58] Field of Search ............... 523/137, 205; 524/439, 524/440, 441, 117, 120, 151, 239, 270, 274, 320, 322; 252/512, 513; 428/407, 361, 379, 381, 385

[56] References Cited

U.S. PATENT DOCUMENTS

| 4,404,447 | 9/1984 | Kitamura | 219/64 |
| 4,533,685 | 8/1985 | Hudgin et al. | 524/440 |
| 4,566,990 | 1/1986 | Liu | 524/439 |
| 4,604,413 | 8/1986 | Nabeta | 524/66 |

FOREIGN PATENT DOCUMENTS

| 0083723 | 7/1983 | European Pat. Off. | |
| 133057 | 7/1985 | Japan | 524/441 |
| 296066 | 12/1986 | Japan | 523/137 |
| 2095042 | 9/1982 | United Kingdom | |

*Primary Examiner*—John C. Bleutge
*Assistant Examiner*—David Buttner
*Attorney, Agent, or Firm*—Oblon, Spivak, McClelland, Maier & Neustadt

[57] ABSTRACT

There is provided an electric conductive resin composition formed into a pellet, which includes an electric conductive filler comprising electric conductive fibers and a low-melting point metal, and being coated on the surface thereof with a thermoplastic resin. Flux and/or a phosphorus-based antioxidant may be added to the filler. There is also provided an electromagnetic wave shielding molded product prepared by using the electric conductive resin composition mentioned above, wherein the electric conductive fibers dispersed within the molded product are fixed each other through the low-melting point metal.

30 Claims, 2 Drawing Sheets

CONDUCTIVE RESIN COMPOSITION AND MOLDED PRODUCT USING THE SAME

BACKGROUND OF THE INVENTION

1. Field of the Invention

The present invention relates to a conductive resin composition obtained by mixing conductive fibers into a thermoplastic resin and an electromagnetic wave shielding molded product using the conductive resin composition.

2. Description of the Related Art

Conductive resin compositions obtained by mixing conductive fibers into thermoplastic resins have been used in the fabrication of conductive resin molded products. Carbon-based conductive fibers have been mainly mixed in the above conductive resin compositions, and the resultant compositions have been primarily used in antistatic applications. These compositions do not have high conductivity and are not effective for electromagnetic wave shielding which has received a great deal of attention in recent years. Under these circumstances, metal-based conductive fibers are used to increase the conductivity so as to prepare compositions for electromagnetic wave shielding.

When metal-based conductive fibers (to be referred to as metal fibers hereinafter) are mixed in a thermoplastic resin, the specific gravity of the resultant composition is undesirably increased and the properties inherent to the resin are greatly degraded. Therefore, a mixing ratio of the metal fibers to the resin must be minimized. When the content of the metal fibers is decreased, the conductivity is lowered to greatly limit the application conditions. More specifically, the conductivity is lowered at high temperatures due to a difference between the thermal expansion coefficients of the resin and the metal fibers. For this reason, in practice, the content of the metal fibers is increased to prevent a decrease in conductivity and the application environments are limited. The conventional conductive resin composition and its molded product are used under such limited application environments. In addition, their properties are unstable and therefore their reliability is low.

A method is known to those skilled in the art wherein a low-melting point metal is mixed in a thermoplastic resin. The low-melting point metal has a low bonding strength with the resin. In addition, the resin is separated from the low-melting point metal in preliminary molding for color changeover in a molding machine. As a result, only the metal is scattered, thus endangering workers in the molding process.

SUMMARY OF THE INVENTION

It is an object of the present invention to provide a conductive resin composition excellent in conductivity, and particularly, excellent in stability over time, workability, and reliability.

It is another object of the present invention to provide an electromagnetic wave shielding molded product excellent in stability of electromagnetic wave shielding effect over time and in reliability.

In order to achieve the above objects of the present invention, there is provided a conductive resin composition in which a thermoplastic resin is coated on a surface of a conductive filler comprising conductive fibers and a low-melting point metal, and the thermoplastic resin and the conductive filler are integrally pelletized.

Flux and/or a phosphorus-based antioxidant in an effective amount for improving wettability of the conductive fibers may be added to the conductive filler.

Examples of the conductive fiber used in the present invention are: a metal fiber (e.g., a long copper fiber, a stainless steel fiber, a brass fiber, an aluminum fiber, or a nickel fiber); an organic fiber having a metal layer such as an aluminum or nickel layer on its surface; and an inorganic fiber. The diameter of the conductive fiber is preferably about 5 to 100 $\mu$m. In general, 100 to 10,000 fibers are bundled.

The low-melting point metal used in the present invention is selected in accordance with the molding temperature of the thermoplastic resin and preferably has a melting point slightly higher than that of the thermoplastic resin. Examples of the low-melting point metal are an Sn or Sn-Pb solder, an Sn-Pb-Ag high-temperature solder, an Sn-Pb-Bi low-temperature solder, and a solder described in U.S. Pat. No. 4,533,685. The low-melting point metal may be used in the fibrous form (including a rod-like form and a cotton-like form), a granular form, or a film-like form. The form of the low-melting point metal is not limited to a specific one. A fibrous low-melting point metal may be bundled with the conductive fibers; the surfaces of the conductive fibers may be covered with a low-melting point metal and the fibers may be bundled; or a conductive fiber bundle may be covered with a low-melting point metal. In addition, low-melting metal grains may be sprinkled and attached to the surfaces of the conductive fibers. It is therefore essential to bundle the conductive fibers together with the low-melting point metal.

A preferable flux used in the present invention is an organic acid or resin flux. Examples of the flux are an organic acid flux (e.g., stearic acid, lactic acid, oleic acid, or glutamic acid), resin-based rosin, and active rosin. These fluxes can be used singly or in a combination of at least two materials. A halogen or amine is not preferable since it tends to corrode conductive fibers and molds. The flux is used such that it is contained in a low-melting point metal. The flux improves wettability of the conductive fibers and increases the bonding strength between the low-melting point metal and the conductive fibers.

A typical phosphorus-based antioxidant used in the present invention has the following formula:

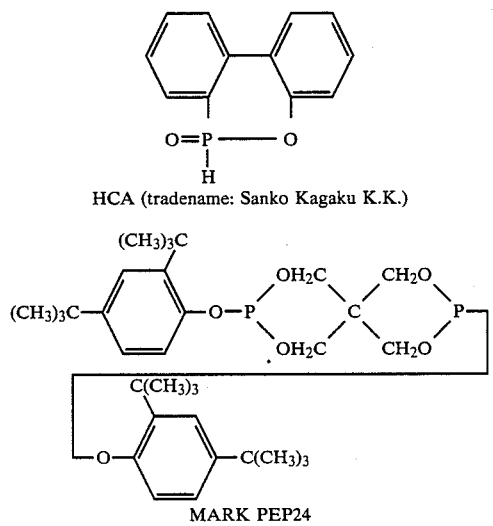

HCA (tradename: Sanko Kagaku K.K.)

MARK PEP24

-continued

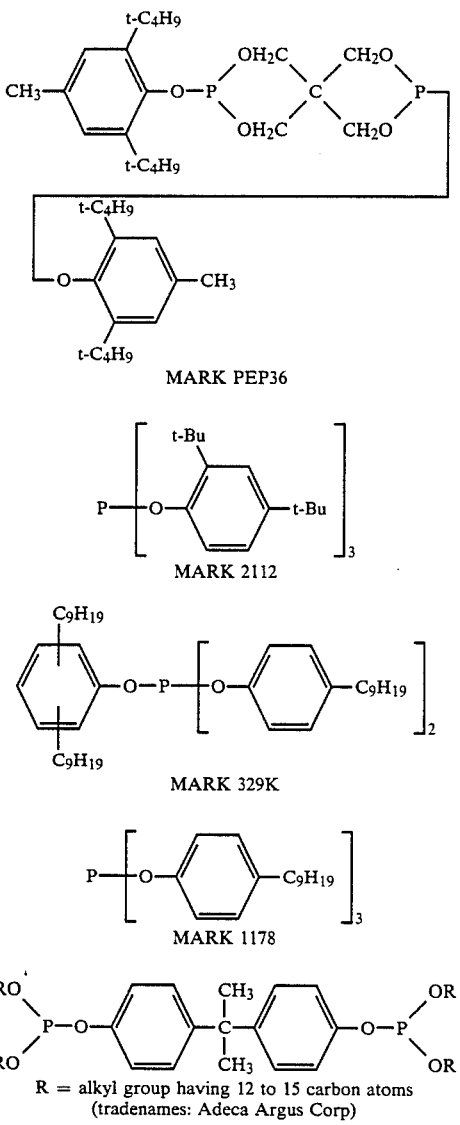

The phosphorus-based antioxidant is preferably mixed in a layer of a thermoplastic resin to be described later.

Examples of the thermoplastic resin coated on the surface of the conductive filler are polypropylene resin, polyethylene resin, polystyrene resin, acrylonitrile-butadiene-styrene resin, denatured polyphenylene oxide resin, polybutylene terephthalate resin, polycarbonate resin, and polyamide resin, and polyetherimide resin.

The content of the conductive fibers is 0.5 to 80 wt% and preferably 5 to 30 wt% with respect to the total weight of the composition. If the content of the conductive fibers is less than 0.5 wt%, the conductivity is excessively low. However, if the content exceeds 30 wt%, flowability and other properties of the conductive resin composition are degraded.

The content of the low-melting point metal is determined to sufficiently bond and coat the conductive fibers and is 5 to 30 wt% and preferably 10 to 20 wt%. If the content of the low-melting point metal is less than 5 wt%, bonding and coating of the conductive fibers cannot be performed and the conductivity is lowered. However, if the content exceeds 30 wt%, the low-melting point metal is separated from the resin, and the physical properties of the resin are undesirably degraded.

The content of the flux in the present invention is 0.1 to 5 wt%, and preferably 2 to 4 wt% with respect to the content of the low-melting point metal. If the content of the flux is less than 0.1 wt%, wettability cannot be improved. However, if the content exceeds 5 wt%, the physical properties of the molded product are degraded, and corrosion and contamination of the molds occur.

The content of the phosphorus-based antioxidant is 0.1 to 5 wt%, and preferably 2 to 4 wt% with respect to the content of the thermoplastic resin. If the content of the phosphorus-based antioxidant is less than 0.1 wt%, an oxide film of the conductive fibers cannot be sufficiently eliminated and solder wettability is poor. However, if the content exceeds 5 wt%, the thermal deformation temperature of the resin is lowered, thus degrading the physical properties of the resin.

The above components, i.e., the conductive fibers and the low-melting point metal, are combined to prepare a conductive filler. A thermoplastic resin is coated on the surface of the conductive filler, and the resultant structure is cut into pellets. The pellets are molded or serve as master pellets. The master pellets are mixed with normal thermoplastic resin pellets (to be referred to as natural pellets) to perform molding.

The flux and the phosphorus-based antioxidant may be contained in the conductive filler in advance or mixed in the thermoplastic resin layer.

When the conductive resin composition is formed into master pellets and the master pellets are used together with the natural pellets, the natural pellets are the same as the master pellets or the same type of master pellets but may be different from the master pellets. In addition, a third synthetic resin (i.e., a resin capable of producing a blend polymer) may be mixed in the above resins to provide a reinforcing effect. For example, when denatured PPO or polycarbonate resin is used as the thermoplastic resin of the master pellets, a styrene thermoplastic resin is preferably used to form natural pellets for a better result. With this, the third synthetic resin formed at the interface has a reinforcing effect. By using these combinations, a molded product with better properties can be obtained.

DESCRIPTION OF THE PREFERRED EMBODIMENTS

A conductive resin composition of the present invention will be manufactured in the following manner, which will be described with reference to the accompanying drawings.

Figure 1A:
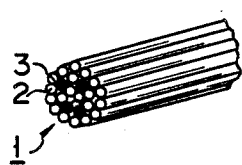
FIGS. 1(A) to 1(D) are perspective views showing conductive fillers according to various embodiments of the present invention.
Figure 2A:
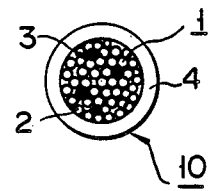
FIGS. 2(A) to 2(D) are sectional views showing pellet-like conductive resin compositions according to various embodiments of the present invention.
Figure 1B:
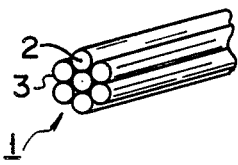
Figure 2B:
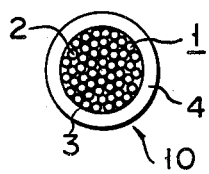
Figure 1C:
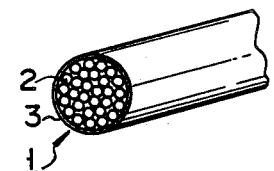
Figure 2C:
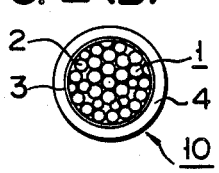
Figure 1D:
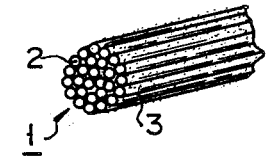
Figure 2D:
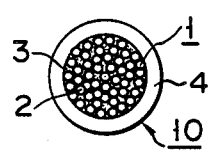

FIGS. 1(A) to 1(D) are perspective views of conductive fillers obtained by bundling long conductive fibers and low-melting point metals. As shown in FIG. 1(A), a predetermined number of low-melting point metal fibers 3 containing a flux and the like as needed are bundled together with conductive fibers 2 to obtain conductive filler 1. As an aggregate of the conductive fibers and the low-melting point metal fibers, as shown in FIG. 1(B), the surfaces of conductive fibers 2 may be covered with low-melting point metal 3 and fibers 2 may be bundled to prepare conductive filler 1. Bundled conductive fibers 2 may be coated with low-melting point metal 3 to prepare conductive filler 1, as shown in FIG. 1(C). Low-melting point metal grains 3 may be attached to the surfaces of conductive fibers 2 to prepare conductive filler 1.

FIGS. 2(A) to 2(D) show cross sections of pellets 10 obtained by coating thermoplastic resin layer 4 containing a phosphorus-based antioxidant as needed on the surface of conductive filler 1 of any of FIGS. 1(A) to 1(D) and by cutting the resultant structure into pieces each having a length of, e.g., 5 to 8 mm. In this case, FIG. 1(A) corresponds to FIG. 2(A); 1(B), to 2(B); 1(C), to 2(C); and 1(D), to 2(D).

Pellet 10 has a circular cross section, but its shape is not limited to a specific shape such as a flat shape.

Figure 3:
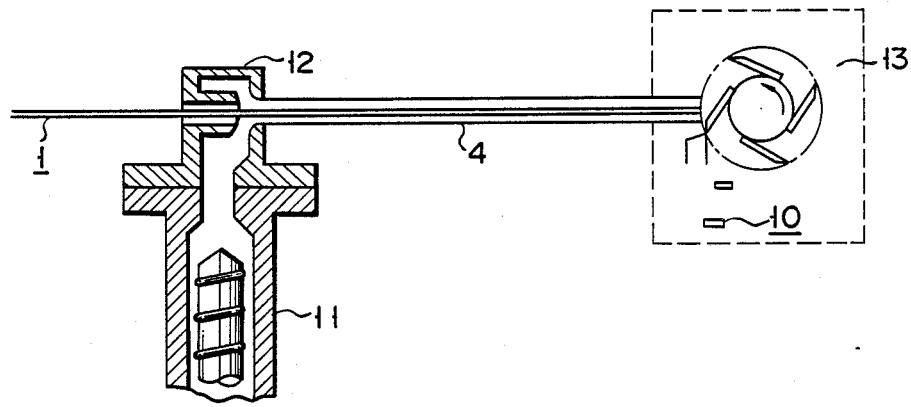
FIG. 3 is a schematic view for explaining an operation for cutting the conductive resin composition into pellets.

Pellets 10 can be manufactured in the following manner. As shown in FIG. 3, conductive filler 1 in any of FIGS. 1(A) to 1(D) is drawn through die 12 in extruder 11 to integrally form thermoplastic resin layer 4 on the surface of conductive filler 1. The resultant structure is cut into pieces each having a proper size by cutting mechanism 13, thereby preparing pellets 10. The manufacturing process of the pellets can be continuously performed due to an economical advantage, but the pellets may be prepared in a batch scheme.

The prepared conductive resin composition is injected at a temperature higher than the melting point of the low-melting metal to obtain molded products for housings and components in electronic, measuring, communication equipment which requires electromagnetic wave shielding.

According to the present invention, the conductive fibers, the low-melting point metal, the flux, the phosphorus-based antioxidant, and the thermoplastic resin function to provide excellent conductivity in the following manner.

Figure 4:
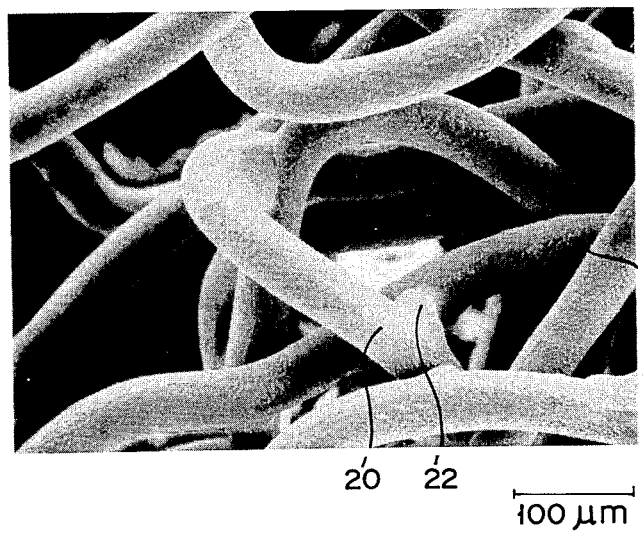
FIG. 4 is an electron-microscopic picture showing an enlarged internal structure of an electromagnetic wave shielding molded product according to the present invention.

In a heating cylinder in an injection molding machine, while the conductive fibers are dispersed in the thermoplastic resin and are injected, cooled, and solidified in the molds, the low-melting point metal is melted and fused and bonded with the conductive fibers. The conductive fibers are bonded by the low-melting point metal in a net-like manner and are cooled and solidified in this state. FIG. 4 is an electron-microscopic photograph of an enlarged internal structure of the product injection-molded using the conductive resin composition of the present invention. The internal structure shown in this photograph was produced by washing the molded product and melting the resin component of the product with methylene chloride thereby obtaining a residual net-like structure which is then photographed. It is readily understood from this photograph that the conductive fibers 20, 21 are entangled and fixed with each other through the low-melting point metal 22 to form a net-like structure. In addition, when a phosphorus-based anti-oxidant or flux is present, the oxide film of the conductive fiber which is formed during the fabrication or drying can be eliminated by the phosphorus-based anti-oxidant or flux during fusion of the conductive fibers and the low-melting point metal, thereby improving wettability of the conductive fibers. The conductive fibers and the low-melting point metal form a rigid net-like structure. If an oxide film is left on the conductive fiber or wettability of the conductive fibers is poor, the conductive fibers are corroded or the low-melting point metal is separated from the fibers. The physical properties of the resin are degraded and the conductivity thereof is also lowered. Since the conductive fibers are entangled to strongly bond with the low-melting point metal so as to form a net-like structure, the conductivity of the composition can be greatly improved, and the physical properties of the resin are not impaired. When a resin component of the molded product is dissolved in a solvent, the net-like structure of the entangled conductive fibers can be visually confirmed.

As is apparent from the above description, according to the conductive resin composition of the present invention, the conductive fibers and the low-melting point metal are used to prepare the conductive filler, and the flux and the phosphorus-based antioxidant are mixed therewith. Therefore, wettability of the conductive fibers can be improved, and the conductive fibers can be strongly bonded by the low-melting point metal. The conductivity of the conductive resin composition is not degraded by environmental changes at high temperatures. The shielding effect stability over time can be improved. Since the conductive resin composition is excellent in conductivity, the amount of conductive filler can be reduced, and the physical properties inherent to the resin are not degraded. Since the low-melting point metal is strongly bonded with the conductive fibers, separation and scattering of the low-melting point metal can be prevented to improve safety of the working environments. In addition, moldability can be improved. When the molded product using the conductive resin composition is used for electronic, measuring, and communication equipment, very high reliability can be obtained.

The present invention will be described in detail by way of its examples.

EXAMPLE 1

300 long copper fibers having a diameter of about 50 $\mu$m and long low-melting point metal fibers (Sn 60%, Pb 40%) having a diameter of 300 $\mu$m were bundled to prepare a conductive filler. TOUGHREX 410 (tradename) as an ABS resin available from Mitsubishi Monsant Kasei K. K. was integrally coated on the conductive filler through a die in an extruder. When the extruded structure was cooled, it was cut into pieces (i.e., a conductive resin composition) each having a diameter of 3 mm and a length of 6 mm. By using this conductive resin composition, injection molding was performed to obtain a molded product. The volume resistivity, the electromagnetic wave shielding effect, and mechanical strength of the molded product were tested, and the test results are summarized in Table 1. The shielding effect of the molded product was not degraded in an environmental test at 80° C. for 3,000 hours. A mechanical strength 80% or more of the initial value was retained, thus confirming the conspicuous effect of the present invention.

Comparative Example 1

Conductive resin composition having a diameter of 3 mm and a length of 6 mm was prepared following the same procedures as in Example 1, except that the low-melting point metal was omitted. Following the same procedures as in Example 1, a molded product was prepared by using the above conductive resin composition. The property tests of the molded product were performed, and the test results are summarized in Table 1.

TABLE 1

| Item | Example 1 | Comparative Example 1 (Unit) |
|---|---|---|
| Composition (parts by weight) | | |
| Conductive Filler | | |
| 300 Copper Fibers [diameter: 50 μm] | 20 | 20 |
| Low-Melting Point Metal | | |
| Solder Alloy [diameter: 300 μm; Sn 60%, Pb 40%] | 2.4 | — |
| Thermoplastic Resin | | |
| TOUGHREX 410 | 80 | 80 |
| Characteristics | | |
| Volume Resistivity (Ω · cm) | | |
| Initial Value | $3.0 \times 10^{-3}$ | $3.0 \times 10^{-3}$ |
| After 3,000 Hours (80° C.) | $3.3 \times 10^{-3}$ | $7.6 \times 10^8$ |
| Electromagnetic Wave Shielding Effect (dB) | | |
| Initial Value | 51 | 45 |
| After 3,000 Hours (80° C.) | 51 | 5 |
| Bending Strength (retention %) | | |
| Initial Value | 100 | 100 |
| After 3,000 Hours (80° C.) | 87 | 60 |
| Izod Impact Strength (retention %) | | |
| Initial Value | 100 | 100 |
| After 3,000 Hours (80° C.) | 83 | 50 |

EXAMPLE 2

300 copper fibers each having a diameter of 50 μm, low-melting metal point beads (Sn 40%, Pb 60%), and TOUGHREX 410 (tradename) as an ABS resin available from Mitsubishi Monsanto Kasei K. K. and containing HCA (tradename) as a phosphorus-based antioxidant available from Sanko Kagaku K. K. were injected through a die in an injection machine to fuse and form an ABS resin layer on the surface of the copper fibers. The resultant structure was cooled and cut in the longitudinal direction into pieces each having a length of 6 mm by a pelletizer, thereby preparing a conductive resin composition. The copper fiber content of the composition was 60 wt%. Injection molding was performed using this conductive resin composition to obtain a molded product. The volume resistivity and the shielding effect of the molded product were tested, and the test results are summarized in Table 2. The outstanding effects of the present invention were confirmed.

Control 1

A conductive resin composition and its molded product were prepared following the same procedures as in Example 2 except that the phosphorus-based antioxidant was omitted. Following the same procedures as in Example 2, the molded product was tested. The test results are summarized in Table 2.

TABLE 2

| Item | Example 2 | Control 1 (Unit) |
|---|---|---|
| Composition (parts by weight) | | |
| Thermoplastic Resin | | |
| TOUGHREX 410 (ABS resin) | 21 | 21 |
| Conductive Fibers | | |
| 300 Copper Fibers [diameter: 50 μm] | 43 | 43 |
| Low-Melting Point Metal | | |
| Solder Alloy [Sn 40%, Pb 60%] | 6 | 6 |
| Phosphorus-Based Antioxidant | | |
| HCA | 1.0 | — |
| Characteristics | | |
| Volume Resistivity (Ω · cm) | | |
| Initial Value | $3 \times 10^{-3}$ or less | $3 \times 10^{-3}$ |
| After 3,000 Hours (80° C.) | $3 \times 10^{-3}$ or less | $9.5 \times 10^{-1}$ |
| Electromagnetic Wave Shielding Effect [electric field: 300 MHz](dB) | | |
| Initial Value | 53 or more | 53 |
| After 3,000 Hours (80° C.) | 53 or more | 32 |

EXAMPLE 3

300 long copper fibers each having a diameter of about 50 μm and one long low-melting point metal fiber (Sn 60%, Pb 40%) having a diameter of 300 μm and containing 2 wt% of a flux were bundled to prepare a conductive filler. TOUGHREX 410 (tradename) as an ABS resin available from Mitsubishi Monsanto Kasei K. K. and containing 2 wt% of MARK PEP 24 (tradename) as a phosphorus-based antioxidant available from Adeca Argus kagaku K. K. were injected together with the filler through a die in an injection machine to integrally form an ABS resin layer on the filler. After the resultant structure was cooled, it was cut into pieces each having a diameter of 3 mm and a length of 6 mm, thereby preparing a conductive resin composition. Injection molding was performed using this conductive resin composition. The volume resistivity, the electromagnetic wave shielding effect, and mechanical strength of the molded product were tested, and test results are summarized in Table 3. The molded product was not degraded after an environmental test at 80° C. for 3,000 hours. A mechanical strength 80% or more of the initial value was retained. The outstanding effects of the present invention were confirmed.

Comparative Example 2

A conductive resin composition having a diameter of 3 mm and a length of 6 mm was prepared following the same procedures as in Example 3, except that the low-melting point metal, the flux, and the phosphorus-based antioxidant were omitted. Following the same procedures as in Example 3, a molded product was prepared by using the above conductive resin composition. The property tests of the molded product were performed, and the test results are summarized in Table 3.

TABLE 3

| Item | Example 3 | Comparative Example 2 (Unit) |
|---|---|---|
| Composition (parts by weight) | | |
| Conductive Filler | | |
| 300 Copper Fibers [diameter: 50 μm] | 20 | 20 |
| Low-Melting Point Metal [diameter: 300 μm, Sn 60%, Pb 40%] | 2.4 | — |
| Flux | | |
| Rosin | 0.05 | — |
| Phosphorus-Based Antioxidant *1 | | |
| MARK PEP24 | 1.6 | — |
| Thermoplastic Resin *2 | | |

TABLE 3-continued

| Item | Example 3 | Comparative Example 2 (Unit) |
|---|---|---|
| TOUGHREX 410 | 80 | 80 |
| Characteristics | | |
| Volume Resistivity ($\Omega \cdot$ cm) | | |
| Initial Value | $3.0 \times 10^{-3}$ | $2.9 \times 10^{-3}$ |
| After 3,000 Hours (80° C.) | $3.2 \times 10^{-3}$ | $7.6 \times 10^{8}$ |
| Electromagnetic Wave Shielding Effect (dB) | | |
| Initial Value | 50 | 40 |
| After 3,000 Hours (80° C.) | 50 | 7 |
| Bending Strength (retention %) | | |
| Initial Value | 100 | 100 |
| After 3,000 Hours (80° C.) | 87 | 63 |
| Izod Impact Strength (retention %) | | |
| Initial Value | 100 | 100 |
| After 3,000 Hours (80° C.) | 83 | 51 |

EXAMPLE 4

300 copper fibers each having a diameter of 50 $\mu$m were bundled and low-melting point metal fibers (Sn 60%, Pb 40%) each having a diameter of 300 $\mu$m were bundled around the upper fibers to prepare a conductive filler. TOUGHREX 410 (tradename) as an ABS resin available from Mitsubishi Monsanto Kasei K. K. together with the conductive filler were injected through a die in an injection machine to form an ABS resin layer on the conductive filler. The resultant structure was cooled and cut in the longitudinal direction into pieces each having a length of 6 mm by a pelletizer, thereby preparing master pellets. Natural pellets of TOUGHREX 410 (described above) were mixed with the master pellets to prepare a conductive resin composition. In this case, the content of the copper fibers was 30 wt%. Injection molding was performed using this conductive resin composition to prepare a molded product. The volume resistivity and the shielding effect of the molded product were tested, and test results are summarized in Table 4. The outstanding effects of the present invention were confirmed.

Comparative Example 3

Master pellets, a conductive resin composition, and a molded product were prepared following the same procedures as in Example 4 except that the low-melting point metal was omitted. The molded product was tested following the same procedures as in Example 4, and test results are summarized in Table 4.

TABLE 4

| Item | Example 4 | Comparative Example 3 (Unit) |
|---|---|---|
| Composition (parts by weight) | | |
| Thermoplastic Resin | | |
| ABS Resin TOUGHREX 410 | 100 | 100 |
| Copper Fibers [diameter: 50 $\mu$m] | 43 | 43 |
| Low-Melting Point Metal | | |
| [300 $\mu$m; Sn 60%, Pb 40%] | 6 | — |
| Characteristics | | |
| Volume Resistivity ($\Omega \cdot$ cm) | | |
| Initial Value | $3 \times 10^{-3}$ | $3 \times 10^{-3}$ |
| After 3,000 Hours (80° C.) | $3 \times 10^{-3}$ | $4 \times 10^{2}$ |
| Electromagnetic Wave Shielding Effect | | |
| [electric field: 300 MHz](dB) | | |
| Initial Value | 53 | 53 |
| After 3,000 Hours (80° C.) | 52 | 23 |

EXAMPLE 5

300 copper fibers each having a diameter of 50 $\mu$m were bundled, and low-melting point metal fibers (Sn 60%, Pb 40%) containing rosin (5 wt%) and each having a diameter of 300 $\mu$m were bundled around the copper fibers to prepare a conductive filler. TOUGHREX 410 (tradename) as an ABS resin available from Mitsubishi Monsanto Kasei K. K. was injected together with the conductive filler through a die in an injection molding machine to form a TOUGHREX 410 layer on the surface of the conductive filler. The resultant structure was cooled and cut in the longitudinal direction into pieces each having a length of 3 mm by a pelletizer, thereby preparing master pellets. Natural pellets of TOUGHREX 410 were mixed with the master pellets to prepare a conductive resin composition. In this case, the content of the copper fibers was 20 wt%. Injection molding was performed using this conductive resin composition to prepare a molded product. The volume resistivity and the shielding effect of the molded product were tested, and test results are summarized in Table 5. The outstanding effects of the present invention were confirmed.

Control 2

Master pellets, a conductive resin composition, and a molded product were prepared following the same procedures as in Example 5 except that a low-melting point metal was omitted. The molded product was tested following the same procedures as in Example 5, and test results are summarized in Table 5.

TABLE 5

| Item | Example 5 | Control 2 (Unit) |
|---|---|---|
| Composition (parts by weight) | | |
| Thermoplastic Resin | | |
| ABS resin TOUGHREX 410 | 100 | 100 |
| Copper Fibers [50 $\mu$m] | 26 | 26 |
| Low-Melting Point Metal | | |
| [300 $\mu$m; Sn 60%, Pb 40%] | 3 | 3 |
| Flux [rosin-based flux] | 0.15 | — |
| Characteristics | | |
| Volume Resistivity ($\Omega \cdot$ cm) | | |
| Initial Value | $7.8 \times 10^{-2}$ | $7.0 \times 10^{-2}$ |
| After 3,000 Hours (80° C.) | $9.3 \times 10^{-2}$ | $2.3 \times 10^{5}$ |
| Electromagnetic Wave Shielding Effect | | |
| [electric field: 300 MHz](dB) | | |
| Initial Value | 48 | 48 |
| After 3,000 Hours (80° C.) | 46 | 12 |

EXAMPLE 6

300 copper fibers each having a diameter of 50 $\mu$m were bundled and low-melting point metal fibers (Sn 60%, Pb 40%) each having a diameter of 300 $\mu$m were bundled around the copper fibers to prepare a conductive filler. TOUGHREX 410 (tradename) as an ABS resin available from Mitsubishi Monsanto Kasei K. K. and containing HCA (tradename) as a phosphorus-based antioxidant available from Sanko Kagaku K. K. was injected together with the conductive filler through a die in an injection molding machine to form an ABS resin layer on the surface of the conductive filler. The resultant structure was cooled and cut in the longitudinal direction into pieces each having a length of 5 mm by a pelletizer, thereby preparing master pellets. In this case, the content of the copper fibers in the master pellets was 60 wt%. Natural pellets of TOUGHREX 410 (described above) were mixed with the master pellets to prepare a conductive resin composition. The content of the copper fibers in the composition was 30 wt%. Injection molding was performed using this conductive resin composition to prepare a molded product. The volume resistivity and the shielding effect of the molded product were tested, and test results are summarized in Table 6. The outstanding effects of the present invention were confirmed.

Control 3

Master pellets, a conductive resin composition, and a molded product were prepared following the same procedures as in Example 6 except that the phosphorus-based antioxidant was omitted. The molded product was tested following the same procedures as in Example 6, and test results are summarized in Table 6.

TABLE 6

| Item | Example 6 | (Unit) Control 3 |
| --- | --- | --- |
| Composition (parts by weight) | | |
| Thermoplastic Resin | | |
| ABS resin TOUGHREX 410 | 100 | 100 |
| Copper Fibers [50 μm] | 43 | 43 |
| Low-Melting Point Metal | | |
| [300 μm; Sn 60%, Pb 40%] | 6 | 6 |
| Phosphorus-Based antioxidant | 1.5 | — |
| Characteristics | | |
| Volume Resistivity (Ω · cm) | | |
| Initial Value | $3 \times 10^{-3}$ | $3 \times 10^{-3}$ |
| After 3,000 Hours (80° C.) | $3 \times 10^{-3}$ | $9.5 \times 10^{-1}$ |
| Electromagnetic Wave Shielding Effect | | |
| [electric field: 300 MHz] (dB) | | |
| Initial Value | 53 | 53 |
| After 3,000 Hours (80° C.) | 53 | 32 |

EXAMPLE 7

300 long copper fibers each having a diameter of 50 μm and one long Sn-Pb solder (Sn 60%, Pb 40%) having a diameter of 300 μm and containing 2 wt% of rosin were bundled to prepare a conductive filler. TOUGHREX 410 (tradename) as an ABS resin available from Mitsubishi Monsanto Kasei K. K. and containing 2 wt% of MARK PEP 24 (tradename) as a phosphorus-based antioxidant available from Adeca Argus Kagaku K. K. was injected together with the conductive filler through a die in an extruder to form an ABS resin layer on the conductive filler. The resultant structure was cooled and cut into master pellets. Each master pellet had a diameter of 3 mm and a length of 6 mm. 500 parts by weight of the natural pellets (TOUGHREX 410 described above) were mechanically mixed with 100 parts by weights of the master pellets to prepare a conductive resin composition. The content of the copper fibers was 10 wt%. Injection molding was performed using this conductive resin composition at a temperature higher than the melting point of the low-melting point metal, thereby obtaining a molded product. The volume resistivity, the shielding effect, the bending strength, and the Izod impact strength of the molded product were tested, and test results are summarized in Table 7. Even if the molded product was heated at 80° C. for 3,000 hours, the shielding effect was not degraded. A mechanical strength 83% or more of the initial value was retained, and the outstanding effects of the present invention were confirmed.

Comparative Example 4

TOUGHREX 410 (described above) was coated on 300 long copper fibers (diameter: about 50 μm) through a die in an extruder. The resultant structure was cooled and cut into master pellets. Each master pellet had a diameter of 3 mm and a length of 6 mm. 500 parts by weight of natural pellets (TOUGHREX 410) were mechanically mixed with 100 parts by weight of the master pellets to prepare a conductive resin composition. Following the same procedures as in Example 7, a molded product was prepared using the above conductive resin composition and the properties of the molded product were tested. Test results are summarized in Table 7.

TABLE 7

| Item | Example 7 | (Unit) Comparative Example 4 |
| --- | --- | --- |
| Composition (parts by weight) | | |
| Conductive Filler | | |
| 300 Copper Fibers [diameter: 50 μm] | 53 | 60 |
| Low-Melting Point Metal | | |
| Solder Alloy [Sn 60%, Pb 40%] | 6.5 | — |
| Flux | | |
| Rosin | 0.13 | — |
| Phosphorus-Based Antioxidant | | |
| MARK PEP24 | 0.8 | — |
| Thermoplastic Resin | | |
| TOUGHREX 410 | 539 | 540 |
| Conductive Resin Composition | | |
| Master Pellet | 100 | 100 |
| Natural Pellet | 500 | 500 |
| Characteristics | | |
| Volume Resistivity (Ω · cm) | | |
| Initial Value | $3.2 \times 10^{-3}$ | $3.0 \times 10^{-3}$ |
| After 3,000 Hours (80° C.) | $3.5 \times 10^{-3}$ | $7.6 \times 10^{8}$ |
| Electromagnetic Wave Shielding Effect (dB) | | |
| Initial Value | 53 | 53 |
| After 3,000 Hours (80° C.) | 53 | 7 |
| Bending Strength (retention %) | | |
| Initial Value | 100 | 100 |
| After 3,000 Hours (80° C.) | 87 | 63 |
| Izod Impact Strength (retention %) | | |
| Initial Value | 100 | 100 |
| After 3,000 Hours (80° C.) | 83 | 51 |

EXAMPLE 8

2,000 copper-plated carbon fibers each having a diameter of 8 μm were bundled, and these carbon fibers, low-melting point metal beads (Sn 40%; Pb 60%) and TOUGHREX 410 (tradename) as an ABS resin available from Mitsubishi Monsanto K. K. and containing HCA (tradename) as a phosphorus antioxidant available from SanKo Kagaku K. K. were extruded through a die in an extruder, thereby forming an ABS resin layer on the surface of the copper-plated carbon fibers. The resultant structure was then cooled and was cut by a pelletizer into pellets each having a length of 6 mm in the longitudinal direction of the resultant structure, thereby preparing a conductive resin composition. The content of the copper-plated carbon fibers of this composition was 9 wt%. Injection molding was performed using the conductive composition, and the volume resistivity and the electromagnetic shielding effect of the resultant molded product were tested. Test results are summarized in Table 8, and outstanding effects of the present invention were confirmed.

EXAMPLE 9

1.600 copper-plated glass fibers each having a diameter of 15 μm were bundled, and these glass fibers, low-melting point metal beads (Sn 40%; Pb 60%) and TOUGHREX 410 (described above) containing HCA (described above) were extruded through a die in an extruder, thereby forming an ABS resin layer on the surface of the copper-plated glass fibers. The resultant structure was then cooled and was cut by a pelletizer into pellets each having a length of 6 mm in the longitudinal direction of the resultant structure, thereby preparing a conductive resin composition. The content of the copper-plated glass fibers of this composition was 18 wt%. Injection molding was performed using the conductive composition, and the volume resistivity and the electromagnetic shielding effect of the resultant molded product were tested. Test results are summarized in Table 8, and outstanding effects of the present invention were confirmed.

temperature higher than a melting point of the low-melting point metal to prepare a molded product. The volume resistivity, the electromagnetic shielding effect, the bending strength, and the Izod impact strength of the molded product were tested, and test results are summarized in Table 8. Even after the molded body was heated at 80° C. for 3,000 hours, the shield hardness was not lowered, and a mechanical strength 88% or more of the initial value was retained. Outstanding effects of the present invention were confirmed.

TABLE 8

| Item | | Example 8 | Example 9 | Example 10 |
|---|---|---|---|---|
| Composition (parts by weight) | | | | |
| Conductive Filling Machine | | | | |
| 2,000 copper-plated carbon fibers (diameter: 8 μm) | | 10 | — | — |
| 1,600 copper-plated glass fibers (diameter: 15 μm) | | — | 10 | — |
| 1,000 stainless fibers (diameter: 8 μm) | | — | — | 30 |
| Low-melting point metal Solder alloy (Sn 60%; Pb 40%) | | 3 | 3 | 9 |
| Thermoplastic Resin (TOUGHREX 410) | | 90 | 80 | 570 |
| Flux (rosin) | | — | — | 0.18 |
| Phosphorus antioxidant | HCA<br>MARK PEP 24 | 4.5 | 4.0 | 1.4 |
| Conductive Resin Composition | | | | |
| Master pellet | | — | — | 100 |
| Natural pellet | | — | — | 500 |
| Properties | | | | |
| Volume resistivity (Ω · cm) | Initial value | $1.2 \times 10^{-1}$ | $5.0 \times 10^{-1}$ | $8.5 \times 10^{-2}$ |
| | After 3,000 hours (80° C.) | $1.5 \times 10^{-1}$ | $5.5 \times 10^{-1}$ | $9.2 \times 10^{-2}$ |
| Electromagnetic wave shielding effect (dB) | Initial value | 38 | 34 | 44 |
| | After 3,000 hours (80° C.) | 37 | 33 | 43 |
| Bending Strength (retention ratio %) | Initial value | — | — | 100 |
| | After 3,000 hours (80° C.) | — | — | 92 |
| Izod impact strength (retention ratio %) | Initial value | — | — | 100 |
| | After 3,000 hours (80° C.) | — | — | 88 |

EXAMPLE 10

1,000 long stainless fibers each having a diameter of 8 μm and one long Sn-Pb solder fiber (Sn 60%, Pb 40%) having a diameter of 300 μm were bundled to prepare a conductive filler. The conductive filler and TOUGHREX 410 (tradename) as an ABS resin available from Mitsubishi Monsanto Kasei K. K. and containing MARK PEP 24 (tradename) as a phosphorus antioxidant available from Adeca Argus Kagaku K. K. were extruded through a die in an extruder to form a TOUGHREX layer on the conductive filler. The resultant structure was cooled and cut into master pellets. Each master pellet had a diameter of 3 mm and a length of 6 mm. 100 parts by weight of master pellets were mechanically mixed with 500 parts by weight of natural pellets (TOUGHREX 410 described above) to prepare a conductive resin composition. In this case, the content of the stainless fibers was 5 wt%. Injection molding was performed using this conductive resin composition at a

What is claimed is:

1. A pelletized conductive resin composition comprising a thermoplastic resin layer formed on the surface of a conductive filler comprising conductive fibers and a low-melting point metal having a melting point higher than that of the thermoplastic resin and lower than the molding temperature of the conductive resin composition, and an effective amount of a phosphorus-based antioxidant to improve the wettability of the conductive fibers.

2. A composition according to claim 1, wherein a content of the conductive fibers is 0.5 to 80 wt% with respect to a total weight of the conductive resin composition, and a content of the low-melting point metal is 5 to 30 wt% with respect to the content of the conductive fibers.

3. A composition according to claim 1, wherein the conductive fibers comprise metal fibers.

4. A composition according to claim 3, wherein the metal fibers are at least one material selected from the group consisting of a copper fiber, a stainless steel fiber, a brass fiber, an aluminum fiber, and a nickel fiber.

5. A composition according to claim 3, wherein the metal fibers comprise copper fibers.

6. A composition according to claim 1, wherein the conductive fibers comprise organic or inorganic fibers covered with a metal layer.

7. A composition according to claim 6, wherein the metal layer is made of a material selected from the group consisting of copper, aluminum and nickel.

8. A composition according to claim 1, wherein each of the conductive fibers has a diameter falling within a range of 5 to 100 μm.

9. A composition according to claim 8, wherein 100 to 10,000 conductive fibers are contained per pellet.

10. A composition according to claim 1, wherein the low-melting point metal is at least one metal selected from the group consisting of tin (Sn) and tin-zinc (Sn-Pb).

11. A composition according to claim 1, wherein the low-melting point metal is fibrous.

12. A composition according to claim 1, wherein the low-melting point metal is granular.

13. A composition according to claim 1, wherein the low-melting point metal covers at least part of a surface of the conductive fibers.

14. A composition according to claim 1, further comprising a flux.

15. A composition according to claim 14, wherein a content of the flux is 0.1 to 5 wt% with respect to a content of the low-melting metal.

16. A composition according to claim 14, wherein the flux is an organic acid flux.

17. A composition according to claim 16, wherein the organic acid flux is an organic acid selected from the group consisting of stearic acid, lactic acid, oleic acid, and glutamic acid.

18. A composition according to claim 14, wherein the flux is a resin flux.

19. A composition according to claim 18, wherein the resin flux is a resin selected from the group consisting of rosin and synthetic rosin having a reactive group.

20. A composition according to claim 1, wherein the content of the phosphorus-based antioxidant is 0.1 to 5 wt% with respect to the content of the thermoplastic resin.

21. A composition according to claim 1, wherein the phosphorus-based antioxidant is mixed in the thermoplastic resin layer.

22. A composition according to claim 1, wherein the thermoplastic resin is a resin selected from the group consisting of polypropylene resin, polyethylene resin, polystyrene resin, acrylonitrile-butadiene-styrene resin, denatured polyphenylene oxide resin, polybutylene terephthalate resin, polycarbonate resin, polyamide resin, and polyetherimide resin.

23. A conductive resin composition comprising master pellets consisting of a mixture of a conductive resin composition as defined in claim 1, and thermoplastic resin pellets.

24. A conductive resin composition comprising master pellets consisting of a mixture of a conductive resin composition as defined in claim 14, and thermoplastic resin pellets.

25. A conductive resin composition according to claim 1, wherein the thermoplastic resin is present substantially only in said thermoplastic resin layer.

26. A conductive resin composition according to claim 14, wherein the thermoplastic resin is present substantially only in said thermoplastic resin layer.

27. An electromagnetic wave shielding molded product prepared by molding the conductive resin composition of claim 1 at a temperature higher than the melting point of the low-melting point metal.

28. An electromagnetic wave shielding molded product prepared by molding the conductive resin composition of claim 14 at a temperature higher than the melting point of the low-melting point metal.

29. An electromagnetic wave shielding molded product prepared by molding the conductive resin composition of claim 23 at a temperature higher than the melting point of the low-melting point metal.

30. An electromagnetic wave shielding molded product prepared by molding the conductive resin composition of claim 24 at a temperature higher than the melting point of the low-melting point metal.

* * * * *